(12) United States Patent
Holm et al.

(10) Patent No.: US 9,293,440 B2
(45) Date of Patent: Mar. 22, 2016

(54) METHOD FOR INTERCONNECTING DIE AND SUBSTRATE IN AN ELECTRONIC PACKAGE

(71) Applicant: The Charles Stark Draper Laboratory, Inc., Cambridge, MA (US)

(72) Inventors: Michael Holm, Cambridge, MA (US); Maurice Karpman, Cambridge, MA (US); Matt Shea, Cambridge, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 40 days.

(21) Appl. No.: 14/134,680

(22) Filed: Dec. 19, 2013

(65) Prior Publication Data

US 2015/0179609 A1    Jun. 25, 2015

(51) Int. Cl.
*H01L 23/495* (2006.01)
*H01L 25/065* (2006.01)
*H01L 21/56* (2006.01)
*H01L 25/00* (2006.01)
*H01L 23/00* (2006.01)
*H01L 23/31* (2006.01)

(52) U.S. Cl.
CPC ............ *H01L 25/0655* (2013.01); *H01L 21/56* (2013.01); *H01L 21/568* (2013.01); *H01L 23/3107* (2013.01); *H01L 24/43* (2013.01); *H01L 24/46* (2013.01); *H01L 25/50* (2013.01); *H01L 2224/18* (2013.01); *H01L 2224/43* (2013.01); *H01L 2224/4501* (2013.01); *H01L 2224/4502* (2013.01); *H01L 2224/45124* (2013.01); *H01L 2224/45144* (2013.01); *H01L 2224/45147* (2013.01); *H01L 2924/19107* (2013.01)

(58) Field of Classification Search
CPC ..... H01L 25/0655; H01L 21/56; H01L 25/50; H01L 23/3107
USPC .......................................................... 257/676
See application file for complete search history.

(56) References Cited

U.S. PATENT DOCUMENTS

| | | | | |
|---|---|---|---|---|
| 6,765,299 | B2 * | 7/2004 | Takahashi et al. | 257/777 |
| 8,008,123 | B2 * | 8/2011 | Miki | 438/107 |
| 8,164,171 | B2 * | 4/2012 | Lin et al. | 257/686 |
| 8,293,574 | B2 * | 10/2012 | Mihara | 438/107 |
| 8,846,521 | B2 * | 9/2014 | Sugizaki | 438/615 |

OTHER PUBLICATIONS

A.C. Fischer et al., "Wire-bonded through-silicon vias with low capacitive substrate coupling", Journal of Micromechanics and Microengineering, vol. 21, pp. 1-8 (2011).

(Continued)

*Primary Examiner* — Luan C Thai
(74) *Attorney, Agent, or Firm* — Nutter McClennen & Fish LLP; Konstantin Linnik

(57) ABSTRACT

A method for interconnecting a die on a substrate of an electronic package. The method includes the steps of forming a plurality of free-end wire bonds on the die, wherein the free-end wire bonds are upstanding from the die, and encapsulating the free-end wire bonds in an encapsulation layer. Planarizing the encapsulation layer is performed so that the free-end wire bonds are exposed for electrical connection. Interconnecting the free-end wire bonds is provided by applying an interconnection layer on the encapsulation layer.

8 Claims, 7 Drawing Sheets

(56) References Cited

OTHER PUBLICATIONS

C. Zwenger et al., "Next Generation Package-on-Package (PoP) Platform with Through Mold Via (TMV™) Interconnection Technology", Originally published in the proceedings of the IMAPS Device Packaging Conference, Scottsdale, AZ, Mar. 10-12, 2009, pp. 1-8.

A. Kumar et al., "Wafer Level Embedding Technology for 3D Wafer Level Embedded Package", 2009 Electronic Components and Technology Conference, pp. 1289-1296.

Y. Jin et al., "Next Generation eWLB (embedded Wafer Level BGA) Packaging", 2010 12th Electronics Packaging Technology Conference, pp. 520-526.

* cited by examiner

METHOD FOR INTERCONNECTING DIE AND SUBSTRATE IN AN ELECTRONIC PACKAGE

BACKGROUND OF THE DISCLOSURE

1. Field of the Disclosure

The subject disclosure relates to methods for forming electronic packages and the electronic packages themselves, and more particularly to an improved method for fabrication of 3D multi-die layer electronic packages.

2. Background of the Related Art

The need to increase packaging density in electronic products has led to the development of 3D packaging. Examples of 3D packaging include stacking die in a single package and interconnecting them using wirebonds or TSVs (through silicon vias or through substrate vias), or using solder to stack packaged devices (package-on-package). Stacked packages have also been connected by patterning the sides of the stack.

All of these methods have significant limitations. Wirebonding places significant geometric restrictions on the die and the physical layout. Soldering limits the number of possible connections. Connecting packages along the edge of the stack introduces significant routing constraints.

SUMMARY OF THE INVENTION

As can be seen, there are problems associated with the traditional techniques of fabricating electronic packages. Fundamental to 3D packaging is the ability to make through-layer feedthroughs with minimal impact on circuit routing or die package density. The subject technology integrates forming the through-layer feedthroughs with the die packaging processes, and allows through-layer feedthroughs to be placed only where necessary.

The subject technology overcomes many of the drawbacks of the prior art by accommodating die of varying geometries, facilitating high routing density and large numbers of connections.

The subject technology allows performing all processing at the wafer level, which leverages existing industry infrastructure and facilitates high volume production. There is no theoretical limit on the number of additional die layers. The subject technology also does not impact circuit routing and the interconnects do not need additional processing for protection.

Further, the subject technology offers significant advantages in the areas of size, weight, power and reliability. Package thickness can be reduced to the minimum required for circuit formation and die integrity. The package's X-Y size can be reduced because the ability to place individual through-layer feedthroughs wherever necessary makes routing more efficient. Power delivery and heat dissipation are improved by the use of solid metal posts. Reliability is maximized reducing the number of interfaces.

The subject technology includes using free-end wirebonds to form copper posts which bring all connections, die and through-package, forward to be planarized into contactable surfaces for interconnection. Because all the connections can be brought forward with similar ease, no connections are buried to the next layer of circuit processing.

In one embodiment, the subject technology is directed to a method for interconnecting a die on a substrate of an electronic package. The method includes the steps of forming a plurality of free-end wire bonds on the die, wherein the free-end wire bonds are upstanding from the die, and encapsulating the free-end wire bonds in an encapsulation layer. Planarizing the encapsulation layer is performed so that the free-end wire bonds are exposed for electrical connection. Interconnecting the free-end wire bonds is provided by applying an interconnection layer.

The method may also include the steps of providing second layer die on the interconnection layer and forming a second plurality of free-end wire bonds on the second layer die, wherein the second plurality of free-end wire bonds are upstanding from the second layer die. Encapsulating the second plurality of free-end wire bonds in a second encapsulation layer also provides protection. Planarizing the second encapsulation layer is used so that the second plurality of free-end wire bonds are exposed for electrical connection. Interconnecting the second plurality of free-end wire bonds is provided by a second interconnection layer. There is no theoretical limit to the number of layers that can be additionally formed in this manner.

In another embodiment, the method includes the steps of removing a wafer substrate under the substrate, and processing a back side of the substrate opposing the die. The method could also include the steps of: forming a second plurality free-end wire bonds on the substrate, wherein the second plurality of free-end wire bonds are upstanding from the substrate; and interconnecting the second plurality of free-end wire bonds when providing the interconnection layer. The first and second plurality of free-end wire bonds may be created independently or at the same time. The height of the free-end wire bonds before planarization is preferably greater than a thickness of the encapsulation layer after planarization. The free-end wire bonds are fabricated from the group consisting of: aluminum; copper; gold; and combinations thereof.

The subject technology also includes an electronic package including a substrate having a bottom side opposing a top side with a die on the top side of the substrate. A plurality of wire bonds upstand from the die, wherein each wire bond has one end coupled to the die and a free end. An encapsulation layer covers the die and the wire bonds so that the free ends are exposed for electrical contact. An interconnection layer on the encapsulation layer electrically interconnects the free ends.

The electronic package may also include second layer die on the interconnection layer and a second plurality of free-end wire bonds on the second layer die. The second plurality of free-end wire bonds are upstanding from the second layer die. A second encapsulation layer covers the second layer die and the second plurality of free-end wire bonds so that the second plurality of free-end wire bonds are exposed for electrical connection. A second interconnecting layer is on the second encapsulation layer for interconnecting the second plurality of free-end wire bonds.

The electronic package may also include a second plurality wire bonds on the substrate. A first end of the second plurality of wire bonds is coupled to the substrate and a free end. The free ends of the second plurality of wire bonds are connected to the interconnection layer.

In another embodiment, the subject technology is directed to a method for fabricating an electronic package including the steps of: providing a substrate; forming a plurality of free-end wire bonds on the substrate, wherein the free-end wire bonds are upstanding from the substrate; encapsulating the free-end wire bonds in an encapsulation layer; and planarizing the encapsulation layer so that the free-end wire bonds are exposed for electrical connection.

It should be appreciated that the present technology can be implemented and utilized in numerous ways, including without limitation as a process, an apparatus, a system, a device, a method for applications now known and later developed. These and other unique features of the technology disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
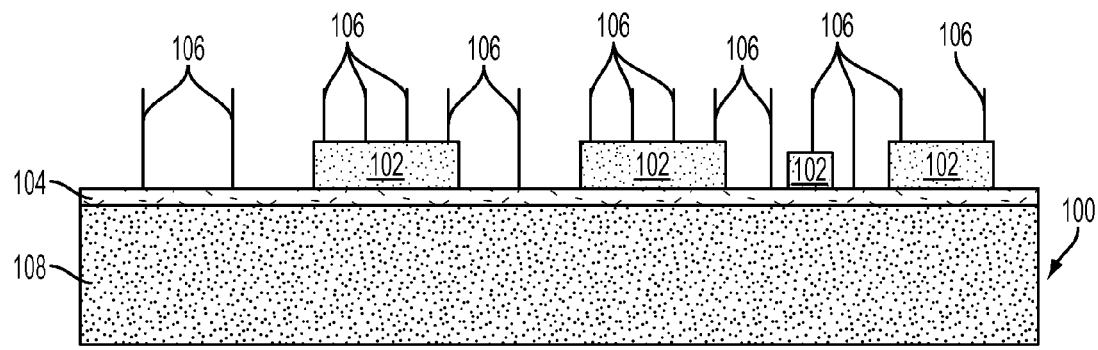
FIG. 1 is an initial cross-sectional view of free-end wire bonds on an electronic package in accordance with a preferred embodiment of the subject disclosure.

The present disclosure overcomes many of the prior art problems associated with forming electronic packages where size, weight and/or power are critical. The advantages, and other features of the system disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

All relative descriptions herein such as top, bottom, side, left, right, up, and down are with reference to the Figures, and not meant in a limiting sense. Unless otherwise specified, the illustrated embodiments can be understood as providing exemplary features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also exemplary and unless otherwise specified, can be altered without materially affecting or limiting the disclosed technology.

In brief overview, the subject technology includes a method for interconnecting a die in an electronic package. The method includes the steps of forming a plurality of free-end wire bonds on the die, wherein the free-end wire bonds are upstanding from the die, and encapsulating the free-end wire bonds in an encapsulation layer. Planarizing the encapsulation layer is performed so that the free-end wire bonds are exposed for electrical connection. Interconnecting the free-end wire bonds is provided by applying an interconnection layer. The method may be repeated to fabricate a plurality of die layers. As a result, wafer level interconnect and wirebonding processes make 3D electronic packages with multiple-die layers. The resulting 3D electronic package can have solderable surfaces on both the front and back sides.

Referring now to FIG. 1, an initial cross-sectional view the partially assembled electronic package 100 is shown somewhat schematically. The free-end wire bonds 106 extend upward from two different die 102 as well as the interconnection layer 104. Any number of wire bonds 106 may be formed on the die 102 and the interconnection layer 104. Any number of die 102 may be arranged in any pattern on the interconnection layer 104. The interconnection layer 104 was previously formed on a wafer substrate 108, typically silicon, alumina or other known materials. A commercially available K&S ICONN wirebonder can be used to form the free-end wire bonds 106, both to the die 102 and the interconnection layer 104. Preferably, the free-end wire bonds 106 have final heights above any of the die 102. The free-end wire bonds 106 can be made from a variety of metals such as aluminum, copper and gold.

Figure 2:
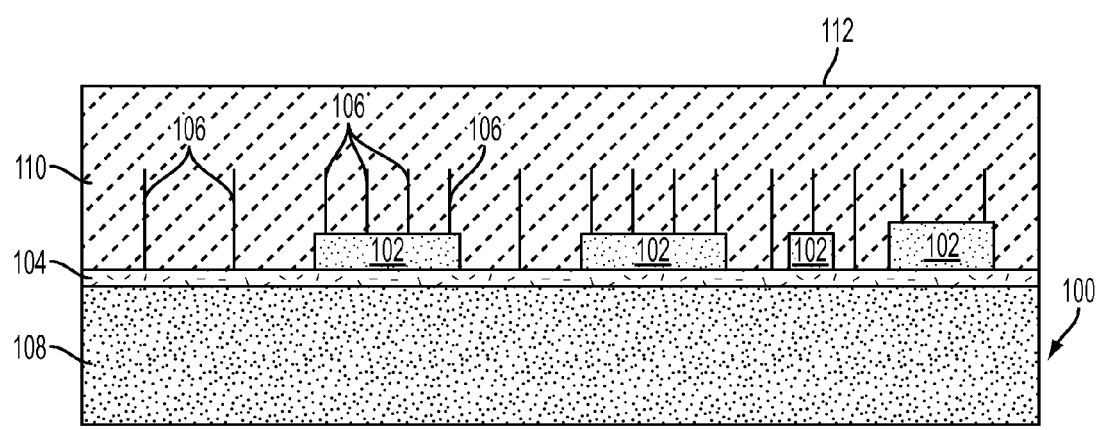
FIG. 2 is a cross-sectional view of the electronic package of FIG. 1 after encapsulation.
Figure 3:
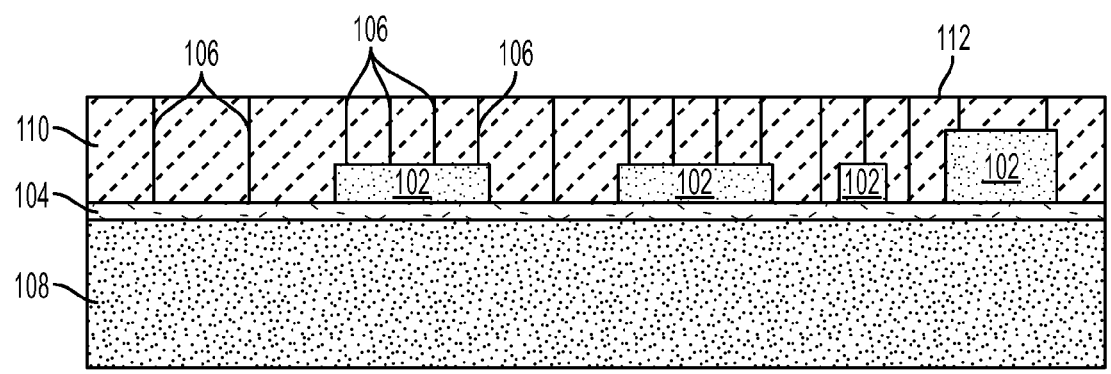
FIG. 3 is a cross-sectional view of the electronic package of FIG. 2 after encapsulation planarization.

Referring now to FIG. 2, another cross-sectional view of the electronic package 100 of FIG. 1 is shown after encapsulation. Encapsulation creates a protective barrier 110 for the die 102. Preferably, the encapsulation barrier 110 additionally covers the free-end wire bonds 106. After the barrier 110 is formed, the top surface 112 is polished or other technique to become planar. The planarization also removes enough of the barrier 110 so that the free-end wire bonds 106 are exposed in the top surface 112 as shown in FIG. 3. By exposing the free-end wire bonds 106, interconnection with the free-end wire bonds 106 is easily made.

Figure 4:
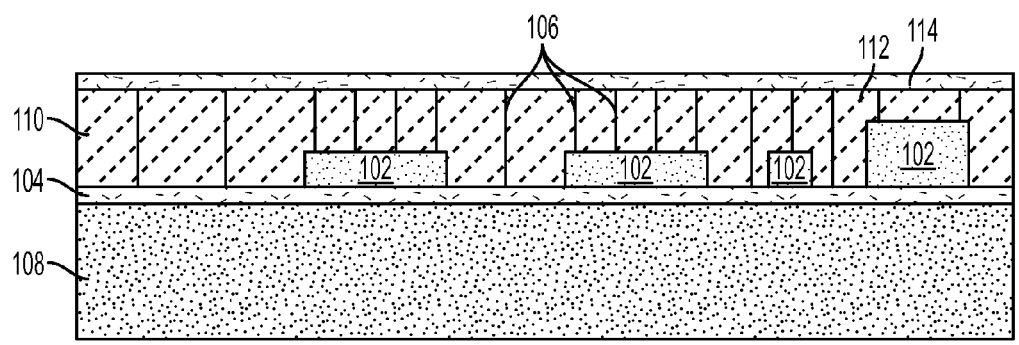
FIG. 4 is a cross-sectional view of the electronic package of FIG. 3 after circuit layer processing.
Figure 5:
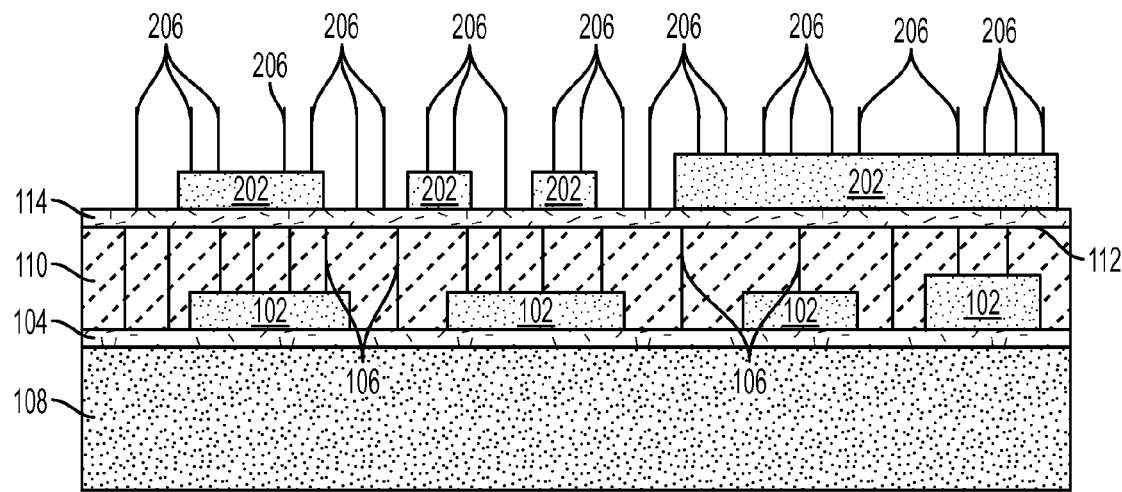
FIG. 5 is a cross-sectional view of the electronic package of FIG. 4 after second layer die and wirebond placement.

In FIG. 4, a cross-sectional view of the electronic package 100 of FIG. 3 after circuit layer processing is shown. The circuit layer processing provides an interconnection layer 114, which may be patterned or otherwise provided to create electrical contacts to the free-end wire bonds 106. Referring now to FIG. 5, in one embodiment, second layer die 202 are placed on the interconnection layer 114. Additional free-end wire bonds 206 are fabricated to extend up from the second layer die 202 and the interconnection layer 114 for similar processing as was performed on the lower layer. As can be seen, the subject technology is not limited to just two layers. Any number of stacked layers is possible using the teachings herein.

Figure 6:
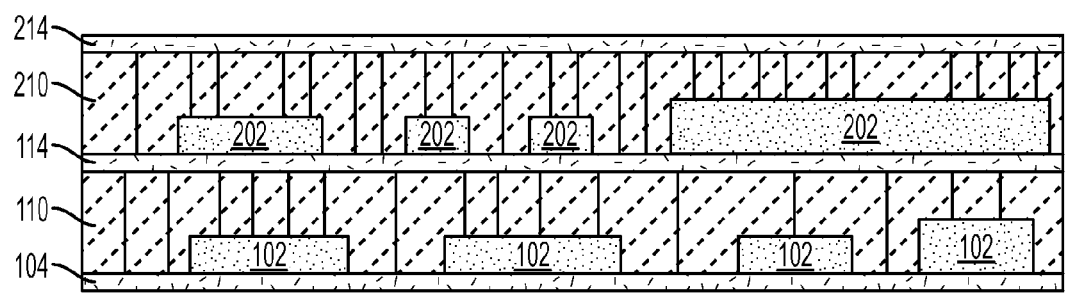
FIG. 6 is a cross-sectional view of the electronic package of FIG. 5 after second layer processing, substrate removal and backside circuit processing.

Referring to FIG. 6, another cross-sectional view of the electronic package 100 of FIG. 5 after second layer processing, substrate removal and backside circuit processing is shown. The electronic package 100 includes a second encapsulation barrier 210 covering the second layer die 202 and the free-end wire bonds 206. An interconnection layer 214 is on the exposed top surface of the encapsulation layer 210 and connects the free-end wire bonds 206. The wafer substrate 108 has been removed and backside circuit processing can be performed. The backside circuit processing may include fabrication of interconnection layers and preparation for place of the electronic package 100 on a printed circuit board and the like Likewise, the topside interconnection layer 214 may include features such as solderable or wirebondable pads to allow connection to other electronic devices or components.

Figure 7:
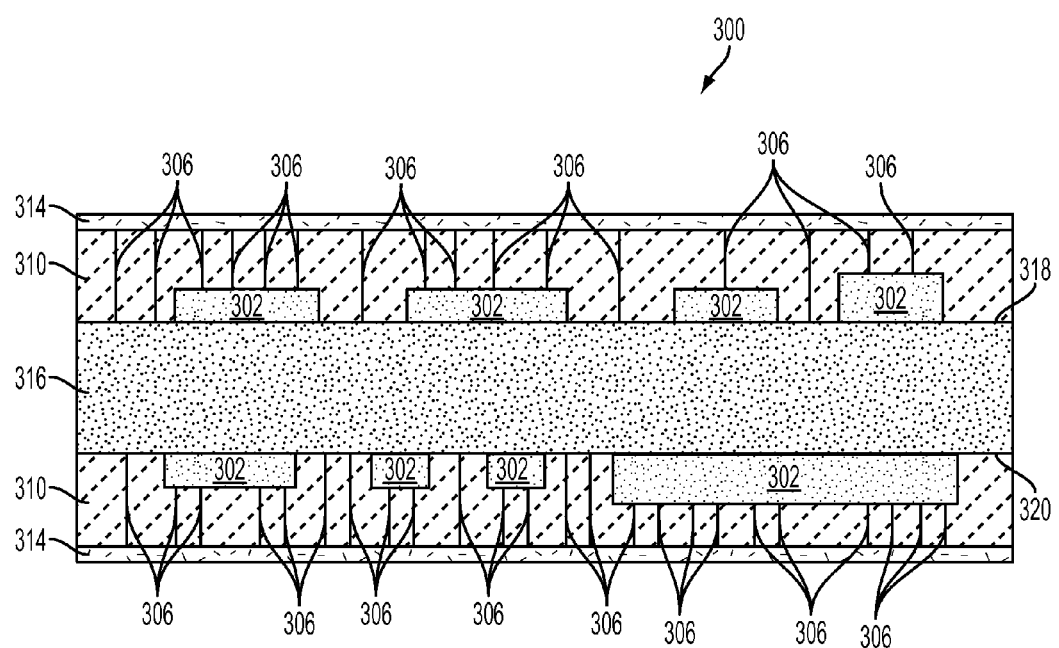
FIG. 7 is a cross-sectional view of an alternate embodiment of the technology where the substrate and interconnection layer have been replaced with a PCB (printed circuit board) and processing has been done on both sides of the PCB.

Referring now to FIG. 7, a cross-sectional view of an alternative partially assembled electronic package 300 of the technology is shown. As will be appreciated by those of ordinary skill in the pertinent art, the electronic package 300 utilizes similar principles to the electronic package 100 described above. Accordingly, like reference numerals preceded by the numeral "3" instead of the numerals "1" or "2", are used to indicate like elements. The primary difference of the electronic package 300 in comparison to the electronic package 100 is that the wafer 108 and interconnection layer 104 have been replaced with a PCB (printed circuit board) 316 and processing has been performed on the top and bottom surfaces 318, 320 of the PCB 316. The PCB 116 has electrical connections (not shown) between top surface 318 and the bottom surface 320. The process for placing die 302, forming the free-end wire bonds 306, encapsulating the die 302, thinning the encapsulant 310 and forming the interconnection layers 314 on top of the encapsulant 310 are performed on one side of the PCB 316 or both as shown in FIG. 7.

In another embodiment, the processing is performed without any die 102. In this embodiment, the interconnection layers 104 and 114 are also optional. After removal of the wafer 108, the resulting structure consists of free-end wire bonds embedded in the encapsulation barrier, with the top and bottom ends of the free-end wire bonds accessible for electrical interconnection. This type of structure can be used as a TSV (through substrate Via) die. TSV's are used in semiconductor packaging to provice electrical connections between the frontside and backside of circuits. The free-end wire bond TSV's are advantageous for reconstructured wafers because they are encapsulated with compatible materials. In addition, the free-end wire bond TSV's can be fabricated with a much greater thickness than is possible with conventional TSV's. For example, using 35 um diameter gold wire, free-end wire bond TSV's have been fabricated that are 1.2 mm thick (i.e. the free-end wire bonds are 1.2 mm tall), while convential TSVs are generally less that 500 um thick.

As can be seen, the subject technology may be utilized to create a variety of electronic packages. As would be appreciated by those of ordinary skill in the pertinent art, the subject technology is applicable to use in a wide variety of applications. The functions of several elements may, in alternative embodiments, be carried out by fewer elements, or a single element. Similarly, in some embodiments, any functional element may perform fewer, or different, operations than those described with respect to the illustrated embodiment. Also, functional elements (e.g., layers) shown as monolithic for purposes of illustration may be incorporated within other functional elements, separated or distributed in various ways in a particular implementation. Further, relative size and location are merely somewhat schematic and it is understood that not only the same but many other embodiments could have varying depictions.

Above, for exemplary purposes only, the die and the substrate are depicted as having a generally rectangular configurations. Those skilled in the art will readily appreciate however, that the subject disclosure is not limited to such configurations. Indeed, it is envisioned and well within the scope of the subject disclosure that die and the substrate could take form in any geometric shape, polygonal or other shape. Without limitation, such shapes could include circle, square, triangle, rectangle, oval, heart, diamond, wreath, cube, pyramid and the like.

While the invention has been described with respect to preferred embodiments, those skilled in the art will readily appreciate that various changes and/or modifications can be made to the invention without departing from the spirit or scope of the invention. For example, each claim may depend from any or all claims, even in a multiple dependent manner, even though such has not been originally claimed.

What is claimed is:

1. An electronic package comprising:
    a substrate having a bottom surface and a top surface;
    a first electronic structure formed on the top surface of the substrate, the first electronic structure comprising:
        a die formed on the top surface of the substrate;
        a plurality of wire bonds upstanding from the die, wherein each wire bond has one end coupled to the die and a free end;
        an encapsulation layer covering the die and the wire bonds, wherein the free ends are exposed;
        an interconnection layer on the encapsulation layer for interconnecting the free ends;
        a second layer die on the interconnection layer;
        a second plurality of free-end wire bonds on the second layer die, wherein the second plurality of free-end wire bonds are upstanding from the second layer die;
        a second encapsulation layer covering the second layer die and the second plurality of free-end wire bonds, wherein the second plurality of free-end wire bonds are exposed for electrical connection; and
        a second interconnecting layer is on the second encapsulation layer for interconnecting the second plurality of free-end wire bonds; and
    a second electronic structure formed on the bottom surface of the substrate, the second electronic structure substantially comprising a mirror image of the first electronic structure.

2. An electronic package as recited in claim 1, further comprising a second plurality wire bonds on the substrate, wherein one end of the second plurality of wire bonds is connected to the interconnection layer.

3. An electronic package as recited in claim 1, wherein a ratio of a height to a diameter of the wire bonds is at least 8:1.

4. An electronic package as recited in claim 1, wherein the wire bonds are fabricated from the group consisting of: aluminum; copper; gold; and combinations thereof.

5. An electronic package as recited in claim 1, wherein the substrate is a printed circuit board assembly.

6. A method for fabricating an electronic package comprising the steps of:
    providing a substrate having a bottom surface and a top surface;
    fabricating a first electronic structure on the top side of the substrate, wherein forming the first electronic structure comprises the steps of:
        a) forming a plurality of free-end wire bonds on the substrate, wherein the free-end wire bonds are upstanding from the substrate;
        b) encapsulating the free-end wire bonds in an encapsulation layer;
        c) planarizing the encapsulation layer so that the free-end wire bonds are exposed for electrical connection;
        d) providing a first die on the substrate, wherein a portion of the free-end wire bonds are connected to the first die;
        e) interconnecting the free-end wire bonds by providing an interconnection layer on the encapsulation layer;
        f) providing second layer die on the interconnection layer;
        g) forming a second plurality of free-end wire bonds on the second layer die, wherein the second plurality of free-end wire bonds are upstanding from the second layer die;
        h) encapsulating the second plurality of free-end wire bonds in a second encapsulation layer;
        i) planarizing the second encapsulation layer so that the second plurality of free-end wire bonds are exposed for electrical connection; and
        j) interconnecting the second plurality of free-end wire bonds by providing a second interconnection layer; and repeating steps a)-j) for the bottom surface of the substrate to fabricate a second electronic structure on the bottom surface of the substrate, wherein the second electronic structure substantially comprises a minor image of the first electronic structure.

7. A method as recited in claim 6, wherein a ratio of a height to a diameter of the free-end wire bonds is at least 8:1.

8. A method as recited in claim 6, wherein a height of the free-end wire bonds before planarization is greater than a thickness of the encapsulation layer after planarization.

* * * * *